(12) United States Patent
Hirtreiter et al.

(10) Patent No.: US 6,290,858 B1
(45) Date of Patent: Sep. 18, 2001

(54) MANUFACTURING METHOD FOR A MICROMECHANICAL DEVICE

(75) Inventors: Josef Hirtreiter, Viechtach; Bernhard Elsner, Kornwestheim, both of (DE)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 09/416,721

(22) Filed: Oct. 13, 1999

(30) Foreign Application Priority Data

Oct. 14, 1998 (DE) ................................. 198 47 305

(51) Int. Cl.$^7$ ................ B44C 1/22; C03C 15/00; H01L 21/00
(52) U.S. Cl. ..................... 216/2; 216/24; 216/41; 216/79; 438/739; 438/743
(58) Field of Search .................. 216/13, 2, 24, 216/95, 33, 41, 67, 75, 79; 438/720, 723, 735, 739, 742, 743

(56) References Cited

U.S. PATENT DOCUMENTS 5,690,839 * 11/1997 Min ..................................... 216/24
6,214,243 * 4/2001 Muenzel et al. ...................... 216/2

\* cited by examiner

*Primary Examiner*—William A. Powell
(74) *Attorney, Agent, or Firm*—Kenyon & Kenyon

(57) ABSTRACT

A manufacturing method for a micromechanical device. In this method, a substrate is prepared with a plating base area to accommodate an anchoring region, and an adhesive layer is formed and structured on the substrate, so that the anchoring region is formed in the plating base area in the form of a quasi-insular region in a recess of the adhesive layer. The quasi-insular region is connected to the adhesive layer outside of the plated based area by at least one thin web. A mask is formed on the adhesive layer and structured so that the anchoring region and an overgrowth region adjacent to the anchoring region remain unmasked. An electroplated layer is deposited on the unmasked anchoring region so that the overgrowth region is overgrown, and the mask and the part of the adhesive layer that has not been overgrown are removed.

14 Claims, 3 Drawing Sheets

MANUFACTURING METHOD FOR A MICROMECHANICAL DEVICE

FIELD OF THE INVENTION

The present invention relates to a manufacturing method for a micromechanical device having an anchoring region provided on a substrate, in which a part of the device, located over the substrate, is anchored, such as, for example, an acceleration sensor or an actuator in the form of a swiveling mirror. Other examples include chemical sensors and passive components in the form of coils, nozzles, etc.

BACKGROUND INFORMATION

Micromechanical devices, which are customarily integrated with analyzing circuits, are used, for example, in automobile manufacturing, machine controls and regulators, as well as in many areas of consumer electronics. For all areas it is essential that the components used and the respective analyzing circuits be cost-effective, reliable and highly functional.

Although the present invention is applicable in principle to any micromechanical device, the present invention elucidated with reference to a micromechanical swiveling mirror.

Micromechanical swiveling mirrors are used, for example, as switching elements in optical telecommunication technology, scanning elements for deflecting a laser beams for bar code recognition or area monitoring, or marking tools.

Using low-stress electroplating, micromechanical swiveling mirrors can be manufactured without warping, in particular, with respect to the mirror surfaces. Such metallic micromechanical components are usually manufactured using LIGA technology, 3D deep lithography or add-on methods.

In particular, the latter add-on, or additive, methods allow the size of the micromechanical arrangements and thus their price to be reduced, opening up new application possibilities. Inexpensive, reliable and durable micromechanical devices result. Additive methods also allow freely movable metallic structures to be created on any desired substrate, such as a silicon substrate, a glass substrate or a ceramic substrate.

Additive methods also allow large, unperforated surfaces to be exposed, so that solid mirror surfaces with dimensions of up to a few millimeters can be manufactured. This method can be mastered inexpensively and well as single-layer electroplating. Multiple electroplating can also be performed in order to manufacture the anchoring regions and the mirror surfaces or suspensions separately, for example. Large swiveling angles can be obtained using sacrificial layers of suitable thicknesses.

Electroplated metal structures normally contain an anchoring region provided on a substrate, in which a part of the corresponding device located over the substrate, for example, a structure that is freely movable over the substrate, is anchored in order to bond it mechanically and/or electrically to the substrate. The substrate should be understood as the base in the general sense.

FIGS. 3a–3g show cross-sectional views of the process steps of a manufacturing method according to the present invention for a micromechanical device.

In FIGS. 3a–3g, 10 denotes a substrate with an operating circuit after final processing, which has a passivation layer 15 with an open terminal pad 20 embedded therein. A sacrificial layer in the form of a first photoresist layer is denoted with 25; an adhesive layer in the form of a sputtered electroplating start layer (plating base) is denoted with 30; a second photoresist layer is denoted with 40; a silicon dioxide layer is denoted with 50; a third photoresist layer is denoted with 60 and an electroplated layer in the form of a nickel plating is denoted with 35.

The point of departure for manufacturing the micromechanical device according to the first embodiment of the present invention is the finished operating circuit with passivation layer 15 and open terminal pad 20.

As FIG. 3a shows, in a first step a first photoresist layer is applied as a sacrificial layer 25 and structured so that terminal pad 20 is exposed. This terminal pad 20 is used as the plating base for the anchoring region of the micromechanical device to be manufactured. First photoresist layer 25 can advantageously be used both for opening terminal pad 20 and as a sacrificial layer if terminal pad 20 must be initially opened in passivation layer 15.

As FIG. 3b shows, in a next step adhesive layer 30 is sputtered on in the form of an electroplating start layer (plating base). In this embodiment, this is a conductive layer made of chromium-copper. Chromium is responsible for the adhesion of first photoresist layer 25 under it; copper is used as the starting layer for the subsequent step of electrodeposition.

As FIG. 3c shows, an approximately 15μ thick second photoresist layer 40 is applied on adhesive layer 30 by centrifugation and set at temperatures typically around 200° C.

Subsequently an approximately 600 nm thick silicon dioxide layer 50 is deposited on second photoresist layer 40 using plasma CVD (chemical vapor phase deposition). Silicon dioxide layer 50 is subsequently used as a hard mask for structuring second photoresist layer 40 under it and is structured for this purpose by a photolithographic process using a third photoresist layer 60 and by subsequent plasma etching, as shown in FIG. 3d.

After overetching silicon dioxide layer 50, trench etching of second photoresist layer 40 is performed using an anisotropic plasma etching process. The resulting structure is shown by FIG. 3e.

In the polymer negative form thus obtained, formed by second photoresist layer 40, a several micrometers thick nickel layer is electrodeposited. This results in the comb structure illustrated in FIGS. 3f and 3g. It should be noted that the individual areas of second electrodeposited layer 35 are connected in areas that are not visible in this cross sectional representation.

Subsequently silicon dioxide layer 50 is removed by wet chemical etching and the polymer negative form of structured second photoresist layer 40 is removed by dry chemical etching.

A selective wet chemical etching of adhesive layer 30 and etching of the sacrificial layer in the form of first photoresist layer 25 in plasma follows, resulting in the structure shown in FIG. 3g. Removal of sacrificial layer 25 in the form of the first photoresist layer is an isotropic etching process, with the photoresist under nickel combs 35 being completely removed.

The result is a micromechanical device with freely movable structures that can be operated as a capacitor, as FIG. 3g shows.

The drawback in the customary manufacturing processes is the fact that the anchoring regions must have a lateral design thickness of typically 30 $\mu$m×30 $\mu$m, since considerable lateral underetching occurs as adhesive layer 30 (plating base) is removed by selective wet chemical etching. This considerably limits the design options.

SUMMARY OF THE INVENTION

The manufacturing method according to the present invention has the advantage over conventional methods in that it allows anchoring regions for additive structures with a minimum size of typically 4 $\mu$m×4 $\mu$m and a spacing of typically 3 $\mu$m to be implemented. This is an improvement by a factor of 7.5 compared to conventional manufacturing methods. It allows novel component layout principles to be implemented using additive methods, with only one mask plane being added, in contrast with the customary method.

The basic idea of the present invention is that the anchoring regions of the adhesive layer are configured as quasi-insular regions, only having a thin web for electrical connection to the rest of the adhesive layer. This results in a lateral overgrowth of the adhesive layer during the growth of the electroplated layer and prevents subsequent underetching when the adhesive layer is removed overgrowth is implemented by forming a mask prior to electrodeposition on the adhesive layer that is structured so that the anchoring region and an overgrowth region adjacent thereto remain unmasked.

According to an advantageous embodiment of the present invention, a sacrificial layer is formed on the substrate, the plating base area is exposed, the adhesive layer is deposited on the sacrificial layer and the plating base layer, and the sacrificial layer is removed after deposition of the electroplated layer. Thus, structures that are freely movable over the substrate can be obtained.

According to another preferred embodiment of the present invention, the thin web or webs are configured so that they have a substantially smaller width than length. This eliminates the danger of underetching when the non-overgrown part of the adhesive layer is removed.

According to another preferred embodiment of the present invention, a metallic terminal pad, preferably of a circuit integrated in the substrate, is provided as the plating base area. Manufacturing as either al discrete device or in a form integrated with an operating circuit is possible. When the micromechanical device is integrated on an integrated circuit, the metal plating of the integrated circuit can be advantageously used for anchoring.

According to another preferred embodiment of the present invention, a first photoresist layer having a thickness of a few micrometers is formed as the sacrificial layer. The photoresist can be easily removed in an isotropic etching process. When a polymeric sacrificial layer is used, the spacing between the mirror element and the substrate can be very accurately adjusted, with spacings from a few micrometers to approximately 150 $\mu$m being possible.

According to another preferred embodiment of the present invention, the first photoresist layer is photolithographically structured to expose the plating base area.

According to another preferred embodiment of the present invention, the adhesive layer is applied by sputtering.

According to another preferred embodiment of the present invention, the adhesive layer is a conductive layer a few nanometers thick and made of Cu—Cr. Chromium serves as the adhesive layer for the photoresist under it, while copper is the plating base for the subsequent electroplating. Other adhesive layers, for example, Cr—Au, etc., are of course also possible.

According to another preferred embodiment of the present invention, the mask is formed on the adhesive layer by the following steps: a second photoresist layer is formed on the adhesive layer; a silicon dioxide layer is formed on the second photoresist layer; a third photoresist layer is photolithographically structured, the silicon dioxide layer is plasma etched to form a hard mask for the second photoresist layer, and the second photoresist layer masked by the structured silicon dioxide layer is etched down to the adhesive layer. In this process, the second photoresist layer serves as the polymeric negative form for electroplating.

According to another preferred embodiment of the present invention, a nickel layer or nickel-cobalt layer is deposited as the electroplated layer. Such stress-free and smooth layers with good reflectivity can be obtained.

According to another preferred embodiment of the present invention, the first and second photoresist layers and the adhesive layer are removed after the electroplated layer is deposited.

According to another preferred embodiment of the present invention, the adhesive layer is removed by a wet etching process.

According to another preferred embodiment of the present invention, the micromechanical device is a swiveling mirror, which is configured so that it can perform torsion oscillations about at least one axis.

DETAILED DESCRIPTION

In the figures, the same reference numbers denote the same or functionally similar elements.

Figure 1:
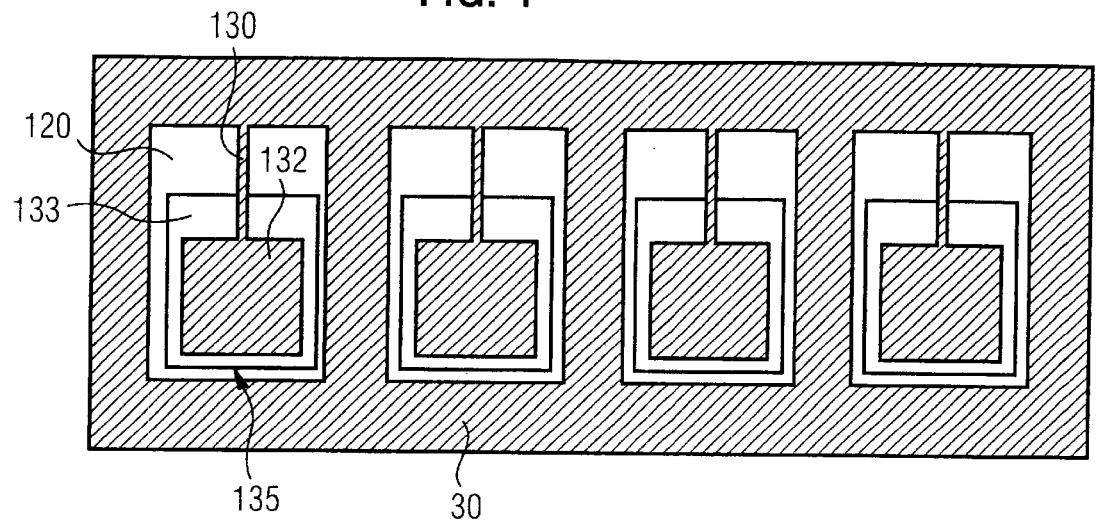
FIG. 1 shows a special step in an embodiment of a manufacturing method according to the present invention.

FIG. 1 shows, as an example, a special step in one embodiment of the manufacturing method according to the present invention.

In addition to the items already referenced, FIG. 1 shows a recess 120 in adhesive layer 30, an anchoring region 132 on terminal pad 20, a thin web 130 to connect anchoring region 132 with the surrounding rest of adhesive layer 30, an overgrowth region 133, and a contour 135 of an electroplated layer grown at a later time (only anchoring posts without finger structure).

Figure 3A:
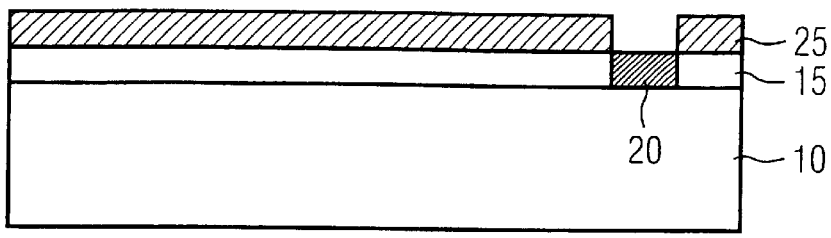
FIG. 3a shows a cross-sectional view a first step of a customary manufacturing method for a micromechanical device.
Figure 3B:
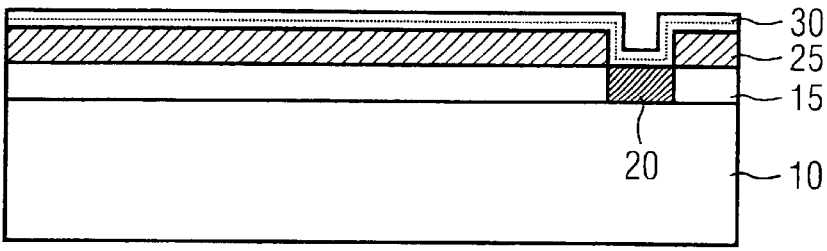
FIG. 3b shows a cross-sectional view of a second step of a customary manufacturing method for a micromechanical device.
Figure 3C:
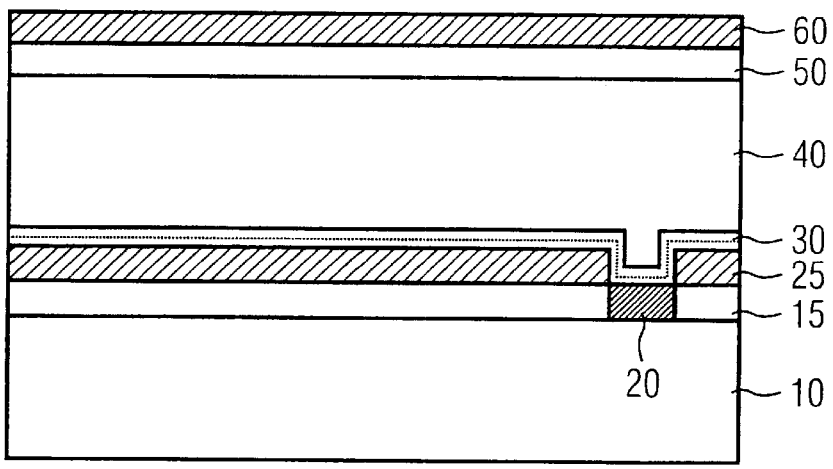
FIG. 3c shows a cross-sectional view of a third step of a customary manufacturing method for a micromechanical device.
Figure 3D:
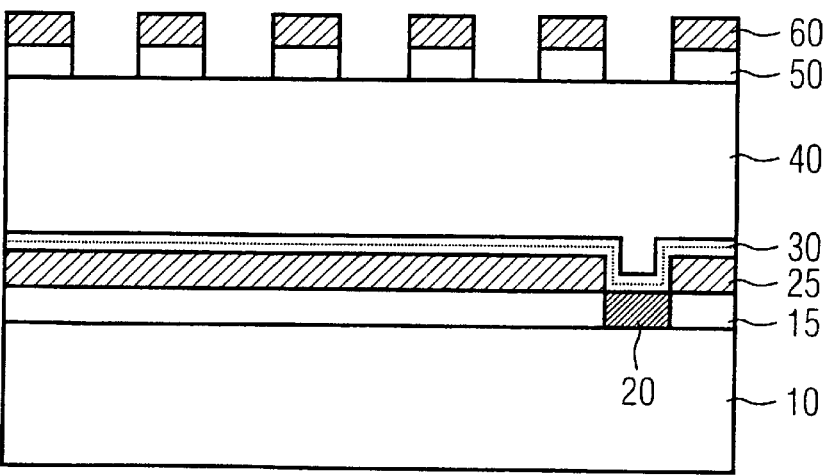
FIG. 3d shows a cross-sectional view of a fourth step of a customary manufacturing method for a micromechanical device.

The basic idea of this embodiment is the structuring of the adhesive layer or electroplating start layer 30 after the stage shown in connection with the customary method in FIG. 3b, prior to applying the thick second photoresist layer 40. Thus, anchoring region 132 is insulated from the surrounding rest of adhesive layer 30 except for thin web 130, which in this example is necessary for electrical contacting in order to achieve electric molding.

After structuring adhesive layer 30, which can be achieved using a customary photolithographic method, the method continues as shown in FIGS. 3c–3g.

In structuring second photoresist layer 40, it must be ensured that overgrowth region 133 surrounding anchoring region 132 be recessed. In the present example, this overgrowth region 133 has the exact width of the vertical plated areas in the contact hole in sacrificial layer 25 of adhesive layer 30 of FIGS. 3b–f.

Figure 3E:
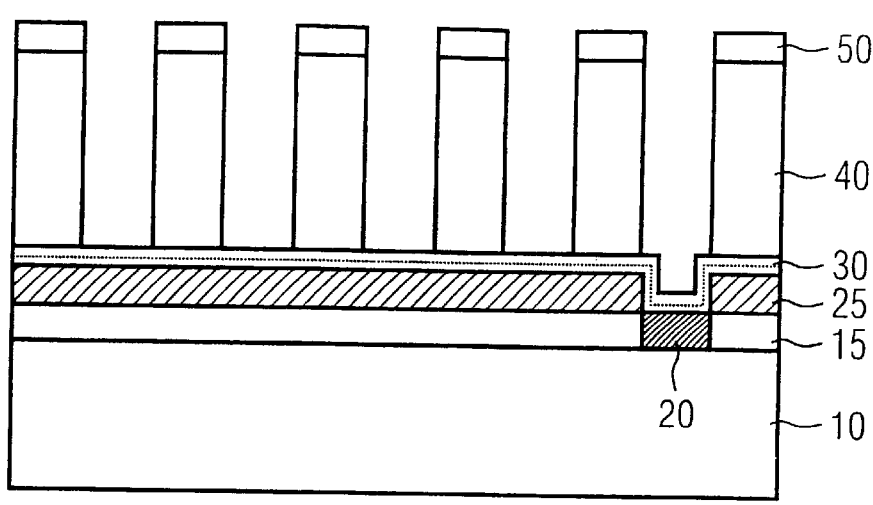
FIG. 3e shows a cross-sectional view of a fifth step of a customary manufacturing method for a micromechanical device.
Figure 3F:
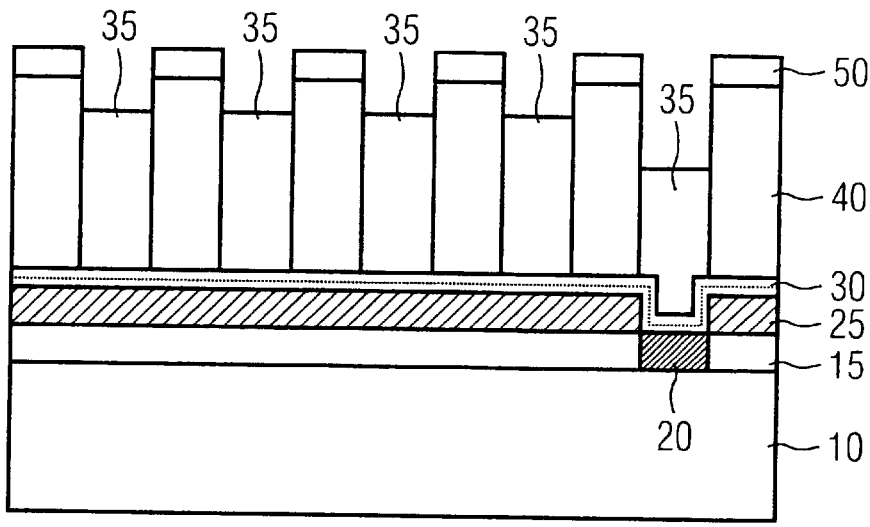
FIG. 3f shows a cross-sectional view of a sixth step of a customary manufacturing method for a micromechanical device.

In particular, structuring causes electroplated layer 35, which is deposited after the step shown in FIG. 3e, to overgrow and laterally cover adhesive layer 30 along contour 135. This results in underetching and thus undesirable weakening or detachment of the anchoring regions being prevented in the wet chemical removal of adhesive layer 30.

Only in the region of thin web 130 can the etching fluid flow in the direction of anchoring region 132, but without reaching it due to the small width of typically 2 μm and the relatively great length of typically 3–5 μm of thin web 130.

Thus the anchoring points and terminal pads can be configured considerably smaller and with a more compact spacing compared to previous methods.

Figure 2:
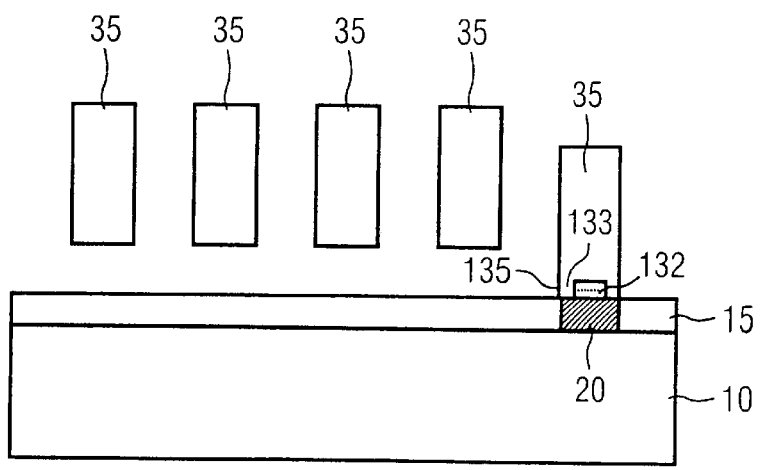
FIG. 2 shows a final step of anchoring when the special step of the embodiment of FIG. 1 is used.
Figure 3G:
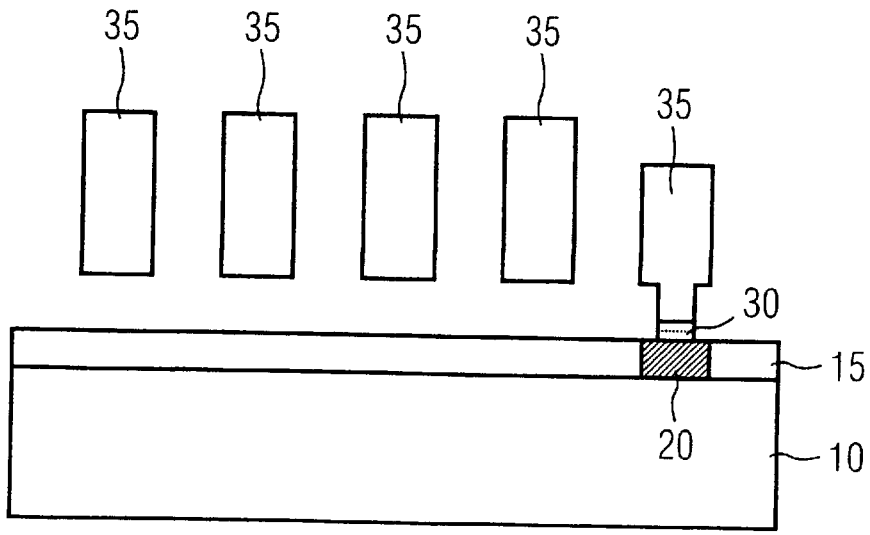
FIG. 3g shows a cross-sectional view of a seventh step of a customary manufacturing method for a micromechanical device.

FIG. 2 shows the final stage of anchoring using the special step of the embodiment according to FIG. 1, which corresponds to the representation of FIG. 3g.

The wet chemical removal of residual adhesive layer 30 after the preparation of electroplated layer 35 (see FIG. 3f) prevents an electrical short circuit of anchoring regions 132.

After the removal of sacrificial layer 25 in the form of the first photoresist layer by an isotropic etching process, with the photoresist under nickel combs 35 being completely removed, the capacitively operable micromechanical device with freely movable structures, shown in FIG. 2, is obtained as a result, for example, a micromechanical swiveling mirror.

Instead of underetching, overgrowth of the edges of terminal region 132 with electroplated layer 35 along contour 135 occurs (with the exception of the small web area not illustrated in FIG. 2).

Although the manufacturing method according to the present invention has been described previously with reference to preferred embodiments, it is not limited thereto, but can be modified in a plurality of manners.

In particular, the choice of the layer materials and thicknesses of the layers applied can be selected depending on the application.

What is claimed is:

1. A manufacturing method for a micromechanical device having an anchoring region arranged on a substrate, a part of the micromechanical device being arranged over the substrate and anchored thereon, comprising the steps of:

preparing the substrate with a plating base area to accommodate the anchoring region;

forming and structuring an adhesive layer on the substrate such that the anchoring region is formed in the plating base area as a quasi-insular region in a recess of the adhesive layer, the quasi-insular region being only connected to a remaining portion of the adhesive layer by at least one thin web;

forming a mask on the adhesive layer to have a structure so that the anchoring region and an overgrowth region adjacent to the anchoring region remain unmasked;

depositing an electroplated layer on the anchoring region while the anchoring region remains unmasked so that the anchoring region adjacent thereto is overgrown; and removing the mask and a part of the adhesive layer corresponding to a part that is not overgrown.

2. The method according to claim 1, further comprising the steps of:

forming a sacrificial layer on the substrate;

exposing the plating base area;

depositing the adhesive layer on the sacrificial layer and the plating base area; and removing the sacrificial layer after depositing the electroplated layer.

3. The method according to claim 1, wherein the at least one thin web has a substantially smaller width than length.

4. The method according to claim 1, wherein the plating base area includes a metallic terminal pad.

5. The method according to claim 1, wherein the metallic terminal pad belongs to a circuit integrated on the substrate.

6. The method according to one of claim 2, further comprising the step of:

forming a first photoresist layer as the sacrificial layer, the first photoresist layer having a thickness of a few micrometers.

7. The method according to claim 6, further comprising the step of:

photolithographically structuring the first photoresist layer to expose the plating base area.

8. The method according to claim 1, wherein the step of forming and structuring the adhesive layer includes the step of:

applying the adhesive layer by sputtering.

9. The method according to claim 8, wherein the adhesive layer is a conductive layer, the conductive layer being a few 100 nm thick and made of one of Cu—Cr and Au—Cr.

10. The method according to claim 6, wherein the step of forming the mask includes the steps of:

forming a second phctoresist layer on the adhesive layer, forming a silicon dioxide layer on the second photoresist layer, photolithographically structuring a third photoresist layer and plasma etching the silicon dioxide layer to form a hard mask for the second photoresist layer, and etching the second photoresist layer down to the adhesive layer, the second photoresist layer being masked by the silicon dioxide layer.

11. The method according claim 1, wherein the electroplated layer includes one of a nickel layer and a nickel-cobalt layer.

12. The method according claim 10, further comprising the step of:

removing the first photoresist layer, the second photoresist layer, and the adhesive layer after performing the step of depositing the electroplated layer.

13. The method according to claim 1, further comprising the step of:

removing the adhesive layer by a wet etching process.

14. The method according to claim 1, wherein the micromechanical device is arranged as a swiveling mirror, the method further comprising the step of:

configuring the swiveling mirror to perform torsion oscillations about at least one axis.

* * * * *